(12) United States Patent
Xie et al.

(10) Patent No.: US 12,733,220 B2
(45) **Date of Patent: *Sep. 8, 2026**

(54) NANOSHEET TRANSISTOR DEVICE WITH BOTTOM ISOLATION

(71) Applicant: INTERNATIONAL BUSINESS MACHINES CORPORATION, Armonk, NY (US)

(72) Inventors: Ruilong Xie, Niskayuna, NY (US); Veeraraghavan S. Basker, Fremont, CA (US); Andrew M. Greene, Slingerlands, NY (US); Pietro Montanini, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 340 days.

This patent is subject to a terminal disclaimer.

(21) Appl. No.: 17/861,960

(22) Filed: Jul. 11, 2022

(65) Prior Publication Data

US 2022/0367626 A1 Nov. 17, 2022

Related U.S. Application Data

(63) Continuation of application No. 16/567,767, filed on Sep. 11, 2019, now Pat. No. 11,387,319.

(51) Int. Cl.
*H01L 21/8234* (2006.01)
*H01L 29/423* (2006.01)
(Continued)

(52) U.S. Cl.
CPC ....... *H10D 62/118* (2025.01); *H10D 30/0243* (2025.01); *H10D 30/62* (2025.01);
(Continued)

(58) Field of Classification Search
CPC ........... H01L 29/0673; H01L 29/42392; H01L 29/66787; H01L 29/78696;
(Continued)

(56) References Cited

U.S. PATENT DOCUMENTS 6,194,773 B1 * 2/2001 Malhi .............. H01L 21/76264 257/E29.022
8,492,228 B1 * 7/2013 Leobandung ... H01L 21/823462 257/E21.409

(Continued)

FOREIGN PATENT DOCUMENTS

CA 2 015 891 C 12/1990

OTHER PUBLICATIONS

Loubet et al., "Stacked Nanosheet gate-all-around transistor to enable scaling beyond FinFET", RedearchGate, Jun. 2017, 3 pages.

(Continued)

*Primary Examiner* — Leonard Chang
*Assistant Examiner* — Tsz K Chiu
(74) *Attorney, Agent, or Firm* — Harrity & Harrity, LLP

(57) ABSTRACT

A method of forming a nanosheet transistor device is provided. The method includes forming a segment stack of alternating intermediate sacrificial segments and nanosheet segments on a bottom sacrificial segment, wherein the segment stack is on a mesa and a nanosheet template in on the segment stack. The method further includes removing the bottom sacrificial layer to form a conduit, and forming a fill layer in the conduit and encapsulating at least a portion of the segment stack.

17 Claims, 12 Drawing Sheets

(51) Int. Cl.

| | |
|---|---|
| ***H10D 30/01*** | (2025.01) |
| ***H10D 30/62*** | (2025.01) |
| ***H10D 62/10*** | (2025.01) |
| ***H10D 64/01*** | (2025.01) |
| ***H10P 14/20*** | (2026.01) |
| ***H10P 14/692*** | (2026.01) |

(52) U.S. Cl.
CPC ....... *H10D 64/017* (2025.01); *H10P 14/3411* (2026.01); *H10P 14/3461* (2026.01); *H10P 14/6927* (2026.01)

(58) Field of Classification Search
CPC ............. H10D 30/6735; H10D 30/024; H10D 62/121; H10D 30/62; H10D 30/6757; H10D 64/017; H10D 30/014; H10D 30/43; H10D 64/021; H10D 84/038; H10D 62/822; H10D 64/258; H10D 64/015; H10D 84/0158; H10D 30/6219; H10D 62/151; H10D 62/116; H10D 62/832; H10D 84/0151; H10D 30/031; H10D 64/018; H10D 64/667; H10D 84/834; H10D 30/797; H10D 30/021; H10D 64/691; H10D 30/60; H10D 62/115; H10D 62/83; H10D 30/0245; H10D 30/6741; H10D 62/119; H10D 64/514; H10D 84/0147; H10D 30/0243; H10D 64/665; H10D 64/693; H10D 62/118; H10D 62/40; H10D 30/027; H10D 30/6211; H10D 30/6215; H10D 30/675; H10D 64/62; H10D 64/671; H10D 84/0128; H10D 84/0193; H10D 30/605; H10D 30/6213; H10D 30/6739; H10D 30/751; H10D 30/794; H10D 62/405; H10D 62/852; H10D 64/66; H10D 64/661; H10D 64/668; H10D 64/68; H10D 64/685; H10D 84/013; H10D 84/85; H10D 84/853; H10D 86/0212; H10D 30/6743; H10D 30/6748; H10D 30/791; H10D 30/792; H10D 62/60; H10D 84/0135; H10D 84/0167; H10D 1/692; H10D 30/019; H10D 30/0277; H10D 30/0323; H10D 30/6713; H10D 62/102; H10D 62/402; H10D 62/8325; H10D 62/834; H10D 64/01; H10D 64/037; H10D 64/205; H10D 64/647; H10D 64/679; H10D 64/681; H10D 64/689; H10D 84/0177; H10D 84/0188; H10D 88/00; H10D 88/01; H10D 1/042; H10D 1/682; H10D 1/684; H10D 1/716; H10D 30/0212; H10D 30/601; H10D 30/67; H10D 30/6729; H10D 30/6737; H10D 30/6744; H10D 62/021; H10D 62/113; H10D 62/364; H10D 62/8164; H10D 62/882; H10D 64/025; H10D 64/23; H10D 64/251; H10D 64/666; H10D 84/0144; H10D 84/017; H10D 84/0172; H10D 84/0184; H10D 84/83; H10D 86/00; H10D 86/01; H10D 86/201
See application file for complete search history.

(56) References Cited

U.S. PATENT DOCUMENTS

| | | | | |
|---|---|---|---|---|
| 8,796,085 | B2 * | 8/2014 | Koldiaev | H01L 21/845 438/270 |
| 8,987,794 | B2 * | 3/2015 | Rachmady | H01L 29/1079 257/E29.022 |
| 9,331,088 | B2 * | 5/2016 | Takaki | G11C 13/0002 |
| 9,647,139 | B2 * | 5/2017 | Doris | H01L 29/66439 |
| 9,704,962 | B1 * | 7/2017 | Pawlak | H01L 29/78696 |
| 9,741,792 | B2 * | 8/2017 | Cheng | H01L 21/76281 |
| 9,935,014 | B1 * | 4/2018 | Cheng | H01L 21/845 |
| 9,947,804 | B1 * | 4/2018 | Frougier | H01L 29/165 |
| 9,984,936 | B1 * | 5/2018 | Xie | H01L 29/66439 |
| 10,032,867 | B1 * | 7/2018 | Yeung | H01L 29/0649 |
| 10,096,688 | B2 * | 10/2018 | Tak | H01L 29/42392 |
| 10,134,901 | B1 * | 11/2018 | Pawlak | H01L 29/7848 |
| 10,141,403 | B1 * | 11/2018 | Cheng | H01L 29/0673 |
| 10,243,054 | B1 * | 3/2019 | Cheng | H01L 27/088 |
| 10,263,100 | B1 * | 4/2019 | Bi | H01L 29/42364 |
| 10,332,803 | B1 * | 6/2019 | Xie | H01L 29/42376 |
| 10,510,620 | B1 * | 12/2019 | Chanemougame | H01L 27/0924 |
| 10,573,755 | B1 * | 2/2020 | Frougier | H01L 29/66742 |
| 10,615,257 | B2 * | 4/2020 | Ok | H01L 21/823878 |
| 2010/0295024 | A1 * | 11/2010 | Pernel | H01L 29/0673 257/E29.245 |
| 2013/0341704 | A1 * | 12/2013 | Rachmady | H01L 29/0673 977/890 |
| 2014/0001441 | A1 * | 1/2014 | Kim | H01L 29/66553 257/29 |
| 2014/0001520 | A1 * | 1/2014 | Glass | H01L 29/167 257/E21.409 |
| 2014/0084370 | A1 * | 3/2014 | Cappellani | B82Y 10/00 257/E29.295 |
| 2014/0151639 | A1 * | 6/2014 | Chang | H01L 29/0673 257/27 |
| 2015/0108573 | A1 * | 4/2015 | Liu | H01L 21/823431 438/155 |
| 2016/0155800 | A1 * | 6/2016 | Zang | H01L 29/785 257/347 |
| 2016/0211322 | A1 * | 7/2016 | Kim | H01L 29/78696 |
| 2016/0315167 | A1 * | 10/2016 | Nakamura | H01L 29/66742 |
| 2017/0053998 | A1 * | 2/2017 | Kim | H01L 29/78618 |
| 2017/0069763 | A1 * | 3/2017 | Doris | H01L 29/78684 |
| 2017/0084690 | A1 * | 3/2017 | Cheng | H01L 29/775 |
| 2017/0133459 | A1 * | 5/2017 | Pranatharthiharan | H01L 29/66795 |
| 2017/0179299 | A1 * | 6/2017 | Bae | H01L 29/42392 |
| 2017/0194143 | A1 * | 7/2017 | Balakrishnan | H01L 29/495 |
| 2017/0250261 | A1 * | 8/2017 | Kim | H01L 29/78696 |
| 2017/0323949 | A1 * | 11/2017 | Loubet | H01L 29/66439 |
| 2018/0033797 | A1 * | 2/2018 | Colinge | H01L 29/40114 |
| 2018/0076095 | A1 * | 3/2018 | Cheng | H01L 21/28079 |
| 2018/0219082 | A1 * | 8/2018 | Guillorn | H01L 29/42392 |
| 2018/0261670 | A1 * | 9/2018 | Yeung | H01L 29/42392 |
| 2018/0308986 | A1 * | 10/2018 | Chao | H01L 29/78603 |
| 2018/0331232 | A1 * | 11/2018 | Frougier | H01L 29/78618 |
| 2019/0058052 | A1 * | 2/2019 | Frougier | H01L 29/78696 |
| 2019/0074362 | A1 * | 3/2019 | Lee | H01L 29/775 |
| 2019/0096996 | A1 * | 3/2019 | Song | B82Y 10/00 |
| 2019/0109052 | A1 * | 4/2019 | Reznicek | H01L 21/823431 |
| 2019/0122937 | A1 * | 4/2019 | Cheng | H01L 29/4908 |
| 2019/0131395 | A1 * | 5/2019 | Lee | H01L 29/0653 |
| 2019/0131396 | A1 * | 5/2019 | Zhang | H01L 21/02236 |
| 2019/0157414 | A1 * | 5/2019 | Ando | H01L 21/02603 |
| 2019/0165135 | A1 * | 5/2019 | Cheng | H01L 29/66818 |
| 2019/0181224 | A1 * | 6/2019 | Zhang | H01L 29/66553 |
| 2019/0189769 | A1 * | 6/2019 | Basker | H01L 29/167 |
| 2019/0189806 | A1 * | 6/2019 | Leobandung | H01L 21/02603 |

(56) References Cited

U.S. PATENT DOCUMENTS

| | | | | |
|---|---|---|---|---|
| 2019/0296128 | A1* | 9/2019 | Smith | H01L 29/0673 |
| 2019/0378915 | A1* | 12/2019 | Frougier | H01L 29/78651 |
| 2020/0035563 | A1* | 1/2020 | Zhang | B82Y 10/00 |
| 2020/0035567 | A1* | 1/2020 | Chanemougame | H01L 29/401 |
| 2020/0152734 | A1* | 5/2020 | Frougier | H01L 29/0649 |
| 2020/0273710 | A1* | 8/2020 | Zhang | H01L 29/66553 |
| 2020/0303503 | A1* | 9/2020 | Lee | H10D 84/0172 |
| 2020/0343146 | A1* | 10/2020 | Cheng | H10D 30/62 |
| 2021/0057544 | A1* | 2/2021 | Lin | H01L 21/28088 |
| 2021/0074809 | A1 | 3/2021 | Xie et al. | |

OTHER PUBLICATIONS

List of IBM Patents or Patent Applications Treated as Related dated Jul. 11, 2022, 2 pages.

* cited by examiner

NANOSHEET TRANSISTOR DEVICE WITH BOTTOM ISOLATION

BACKGROUND

The present invention generally relates to a nanosheet transistor device, and more particularly to a nanosheet transistor device with bottom isolation.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming a nanosheet transistor device is provided. The method includes forming a segment stack of alternating intermediate sacrificial segments and nanosheet segments on a bottom sacrificial segment, wherein the segment stack is on a mesa and a nanosheet template in on the segment stack. The method further includes removing the bottom sacrificial layer to form a conduit, and forming a fill layer in the conduit and encapsulating at least a portion of the segment stack.

In accordance with another embodiment of the present invention, a method of forming a nanosheet transistor device is provided. The method includes forming a segment stack of alternating intermediate sacrificial segments and nanosheet segments on a bottom sacrificial segment, wherein the segment stack is on a mesa and a nanosheet template is on the segment stack. The method further includes depositing a stack liner on the nanosheet template, exposed portions of the segment stack, and the mesa, and depositing a spacer layer on the stack liner. The method further includes forming a gauge block on the spacer layer, and removing a portion of the spacer layer to form a trench between the gauge block and the bottom sacrificial segment and mesa. The method further includes removing an exposed portion of the stack liner and gauge block to widen the trench, and removing the nanosheet template. The method further includes forming a plug in the widened trench, and forming a dummy gate across the segment stack. The method further includes removing the plug and bottom sacrificial segment to form a conduit, and forming a fill layer in the conduit.

In accordance with yet another embodiment of the present invention, a nanosheet transistor device is provided. The nanosheet transistor device includes a fill layer section on a mesa, wherein the mesa is on a substrate. The nanosheet transistor device further includes one or more nanosheet plates above the fill layer section, and a gate dielectric layer on the fill layer section and each of the one or more nanosheet plates. The nanosheet transistor device further includes a conductive gate electrode on the gate dielectric layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a nano sheet type transistor device having increased electrical isolation between a gate structure and the substrate. Formation of a bottom dielectric fill layer between the substrate and the semiconductor nanosheets can avoid over etching during exposure of sacrificial layers. The dielectric fill layer can also increase the dielectric thickness between the conductive gate electrode and the substrate beyond the thickness of a gate dielectric layer alone.

Embodiments of the present invention provide a method of forming a nanosheet type transistor device having increased electrical isolation between a gate structure and the substrate by adding an additional sacrificial layer on the substrate and replacing the additional sacrificial layer with a dielectric fill layer.

Embodiments of the present invention provide a dielectric fill layer on a portion of the substrate by utilizing a liner and spacer layer in combination with an additional sacrificial layer to form a conduit between the substrate and semiconductor nanosheet layers.

Exemplary applications/uses to which the present invention can be applied include, but are not limited to: digital logic devices (e.g. NAND gates, NOR gates, etc.), microprocessors, microcontrollers, memory devices (e.g., SRAM, DRAM), analog circuits, for example, data converters, image sensors, and highly integrated transceivers.

It is to be understood that aspects of the present invention will be described in terms of a given illustrative architecture; however, other architectures, structures, substrate materials and process features and steps can be varied within the scope of aspects of the present invention.

Figure 1:
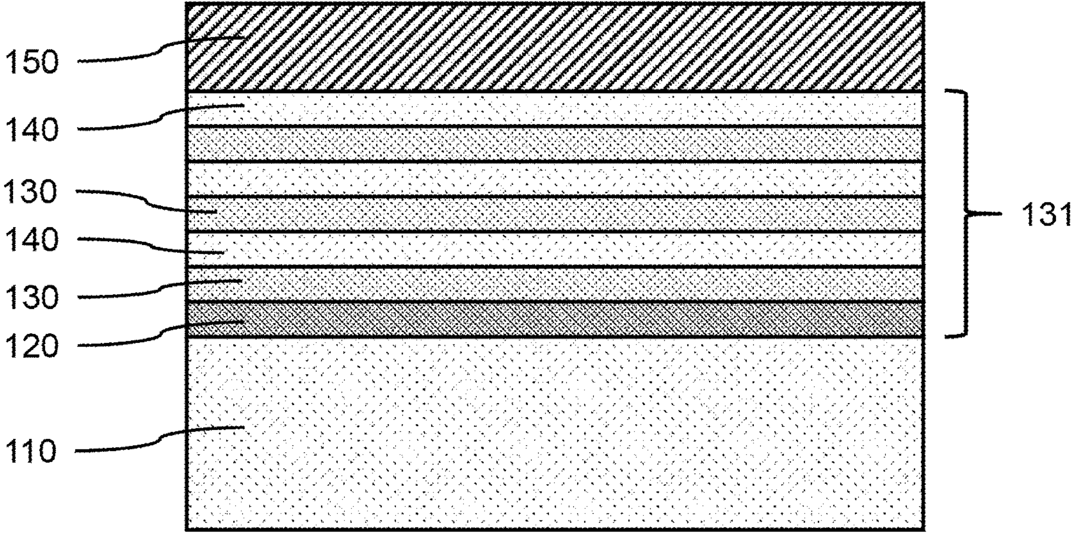
FIG. 1 is a cross-sectional side view showing a stack of alternating sacrificial layers and nanosheet layers on a substrate with a nanosheet template on the stack, in accordance with an embodiment of the present invention.

Referring now to the drawings in which like numerals represent the same or similar elements and initially to FIG. 1, a cross-sectional side view of a stack of alternating sacrificial layers and nanosheet layers on a substrate with a nanosheet template on the stack is shown, in accordance with an embodiment of the present invention.

In one or more embodiments, a substrate 110 can be a semiconductor substrate or a semiconductor-on-insulator (SeOI) substrate, where the substrate includes a region that can form semiconductor devices. In various embodiments, the substrate 110 can include a semiconductor layer that can be made of a group IV semiconductor material, for example, silicon (Si) or germanium (Ge), a IV-IV compound semiconductor material, for example, silicon-germanium (SiGe) or silicon carbide (SiC), a III-V compound semiconductor, for example, gallium arsenide (GaAs), indium phosphide (InP), gallium nitride (GaN), indium-gallium nitride (InGaN), etc. The substrate 110 can be a single crystal semiconductor substrate.

In one or more embodiments, a bottom sacrificial layer 120 can be formed on a substrate 110, where the bottom sacrificial layer 120 can be formed by epitaxial or heteroepitaxial growth. (Epitaxial and heteroepitaxial growth will both be referred to as epitaxial growth for simplicity and clarity.)

In various embodiments, the bottom sacrificial layer 120 can be a material that can be selectively removed without damaging the substrate material and the material of other sacrificial layers. In various embodiments, the bottom sacrificial layer 120 can be silicon-germanium (SiGe) having a germanium concentration of at least 50 atomic percent (at. %), or a germanium concentration in a range of about 55 at. % to about 75 at. %, or about 60 at. %.

In various embodiments, the bottom sacrificial layer 120 can have a thickness in a range of about 4 nanometers (nm) to about 30 nm, or about 8 nm to about 16 nm, although other thicknesses are also contemplated. The thickness of the bottom sacrificial layer 120 can less than the critical thickness at which defects (e.g., threading defects) appear to avoid propagating defects up through subsequent nanosheet layers that can form device channels.

In one or more embodiments, an intermediate sacrificial layer 130 can be formed on the bottom sacrificial layer 120, where the intermediate sacrificial layer 130 can be formed by epitaxial or heteroepitaxial growth.

In various embodiments, the intermediate sacrificial layer 130 can be silicon-germanium (SiGe) having a germanium concentration of less than 50 atomic percent (at. %), or a germanium concentration in a range of about 5 at. % to about 45 at. %, or about 10 at. % to about 40 at. % or about 20 at. % to about 30 at. %, or about 30 at. %, although other concentrations are also contemplated. In various embodiments, the bottom sacrificial layer 120 can be selectively remove relative to the intermediate sacrificial layer 130.

In various embodiments, the intermediate sacrificial layer 130 can have a thickness in a range of about 4 nanometers (nm) to about 20 nm, or about 8 nm to about 15 nm, although other thicknesses are also contemplated.

In one or more embodiments, a nanosheet layer 140 can be formed on the intermediate sacrificial layer 130, where the nanosheet layer 140 can be formed by epitaxial or heteroepitaxial growth on the intermediate sacrificial layer 130. The nanosheet layer 140 can form a device channel for a nanosheet type transistor device.

In various embodiments, the nanosheet layer 140 can be a semiconductor, for example, silicon (Si).

In various embodiments, the nanosheet layer 140 can have a thickness in a range of about 5 nanometers (nm) to about 10 nm, or about 5 nm to about 8 nm, although other thicknesses are also contemplated.

In various embodiments, alternating intermediate sacrificial layers 130 and nanosheet layer 140 can be formed on an underlying layer to form a stack 131 of alternating sacrificial layers 130 and nanosheet layers 140 on the substrate 110. In various embodiments, the top-most layer can be a nanosheet layers 140.

In one or more embodiments, a template layer 150 can be formed on the stack 131 of alternating sacrificial layers 130 and nanosheet layers 140, where the template layer 150 can be formed by a blanket deposition, for example, chemical vapor deposition (CVD), plasma enhanced CVD (PECVD), spin-on, where the template layer 150 can cover the top surface on the top-most layer in the stack 131.

In various embodiments, the template layer 150 can be a hard mask material, including, but not limited to, silicon oxide (SiO), silicon nitride (SiN), silicon oxynitride (SiON), silicon boronitride (SiBN), silicon carbonitride (SiCN), silicon boro carbonitride (SiBCN), and combinations thereof.

Figure 2:
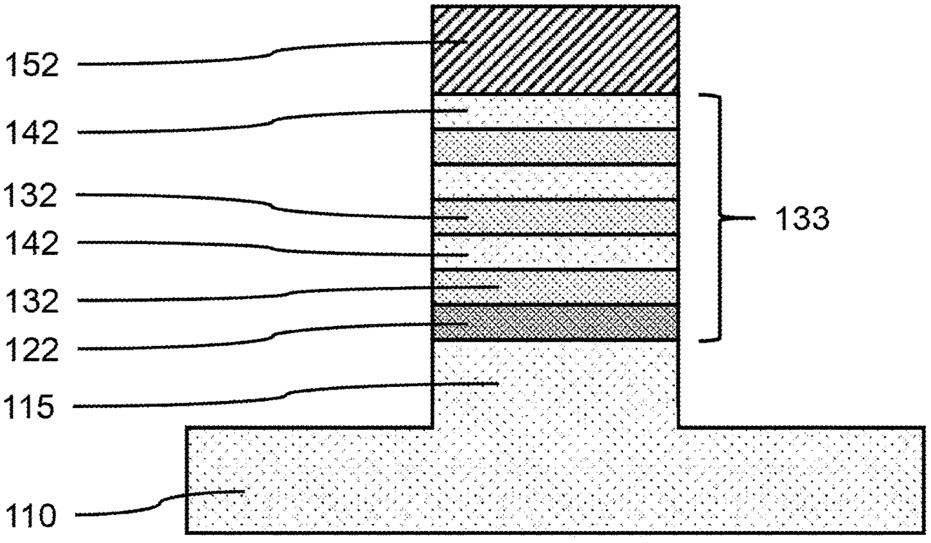
FIG. 2 is a cross-sectional side view showing the stack of alternating sacrificial layers and nanosheet layers patterned using the nanosheet template to form a segment stack of alternating sacrificial segments and nanosheet segments on a mesa with the nanosheet template on the segments, in accordance with an embodiment of the present invention.

FIG. 2 is a cross-sectional side view showing the stack of alternating sacrificial layers and nanosheet layers patterned using the nanosheet template to form a segment stack of alternating sacrificial segments and nanosheet segments on a mesa with the nanosheet template on the segments, in accordance with an embodiment of the present invention.

In one or more embodiments, the template layer 150 can be patterned using lithographic processes and etching (e.g., reactive ion etching (RIE)) to form a nanosheet template 152 on the stack 131 of alternating intermediate sacrificial layers 130 and nanosheet layers 140. The template layer 150 can be used to mask portions of the stack 131 during removal of exposed portions of the alternating sacrificial layers 130 and nanosheet layers 140.

In one or more embodiments, a sequence of etchings can be used to remove portions of the underlying intermediate sacrificial layers 130 and nanosheet layers 140 to form a segment stack 133 of alternating intermediate sacrificial segments 132 and nanosheet segments 142 on a bottom sacrificial segment 122 and mesa 115. In various embodiments, a portion of the substrate 110 below the bottom sacrificial segment 122 can be removed to form a mesa 115 beneath the segment stack 133, where removal of the portion of the substrate increases the space between the nanosheet segments 142 and substrate 110.

Figure 3:
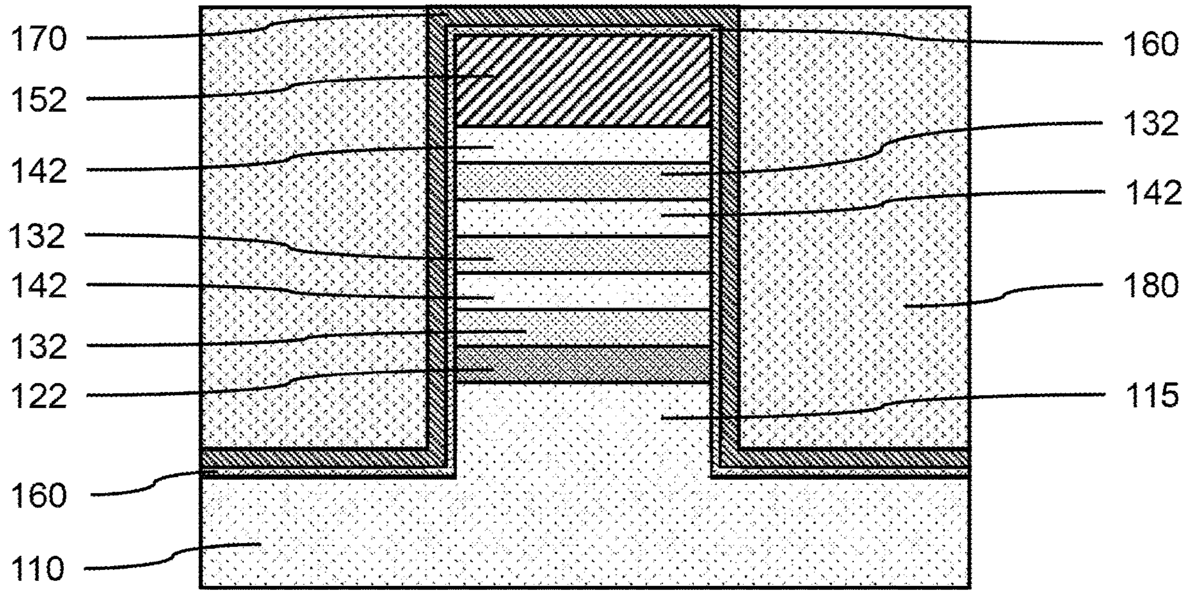
FIG. 3 is a cross-sectional side view showing a stack liner on the stack of alternating sacrificial segments and nanosheet segments, a spacer layer on the stack liner, and a gauge layer formed on the spacer layer, in accordance with an embodiment of the present invention.

FIG. 3 is a cross-sectional side view showing a stack liner on the stack of alternating sacrificial segments and nanosheet segments, a spacer layer on the stack liner, and a gauge layer formed on the spacer layer, in accordance with an embodiment of the present invention.

In one or more embodiments, a stack liner 160 can be formed on the nanosheet template 152 and exposed portions of the segment stack 133 of alternating intermediate sacrificial segments 132 and nanosheet segments 142 on a bottom sacrificial segment 122 and the mesa 115 and exposed surface of the substrate 110. The stack liner 160 can be formed by a conformal deposition, for example, atomic layer deposition (ALD), plasma enhanced ALD (PEALD), and combinations thereof.

In various embodiments, the stack liner 160 can be a dielectric material, including, but not limited to, silicon oxide (SiO), silicon oxynitride (SiON), and combinations thereof.

In various embodiments, the stack liner 160 can have a thickness in a range of about 0.5 nm to about 5 nm, or about 1 nm to about 3 nm, although other thicknesses are also contemplated.

In one or more embodiments, a spacer layer 170 can be formed on the stack liner 160, where the spacer layer 170 can be formed by a conformal deposition (e.g., ALD, PEALD). The spacer layer 170 can cover the stack liner 160.

In various embodiments, the spacer layer 170 can be a dielectric material, including, but not limited to, silicon nitride (SiN), silicon boronitride (SiBN), silicon carbonitride (SiCN), silicon boro carbonitride (SiBCN), silicon oxy carbonitride (SiOCN), silicon oxycarbide (SiCO), and combinations thereof, where the spacer layer 170 can be selectively removed relative to the stack liner 160.

In various embodiments, the spacer layer 170 can have a thickness in a range of about 2 nm to about 15 nm, or about 3 nm to about 10 nm, although other thicknesses are also contemplated.

In one or more embodiments, a gauge layer 180 can be formed on the spacer layer 170, where the gauge layer 180 can be formed by a blanket deposition (e.g., CVD, PECVD, spin-on). The gauge layer 180 can cover the spacer layer 170, where a portion of the gauge layer 180 can be over the nanosheet template 152 and segment stack 133. A chemical-mechanical polishing can be used to remove the portions of the gauge layer 152 above the spacer layer 170, so the portion of the spacer layer 170 on the nanosheet template 152 becomes exposed.

In various embodiments, the gauge layer 180 can be a dielectric material, including, but not limited to, silicon oxide (SiO). In various embodiments, the gauge layer 180 can be selectively removed relative to the spacer layer 170.

Figure 4:
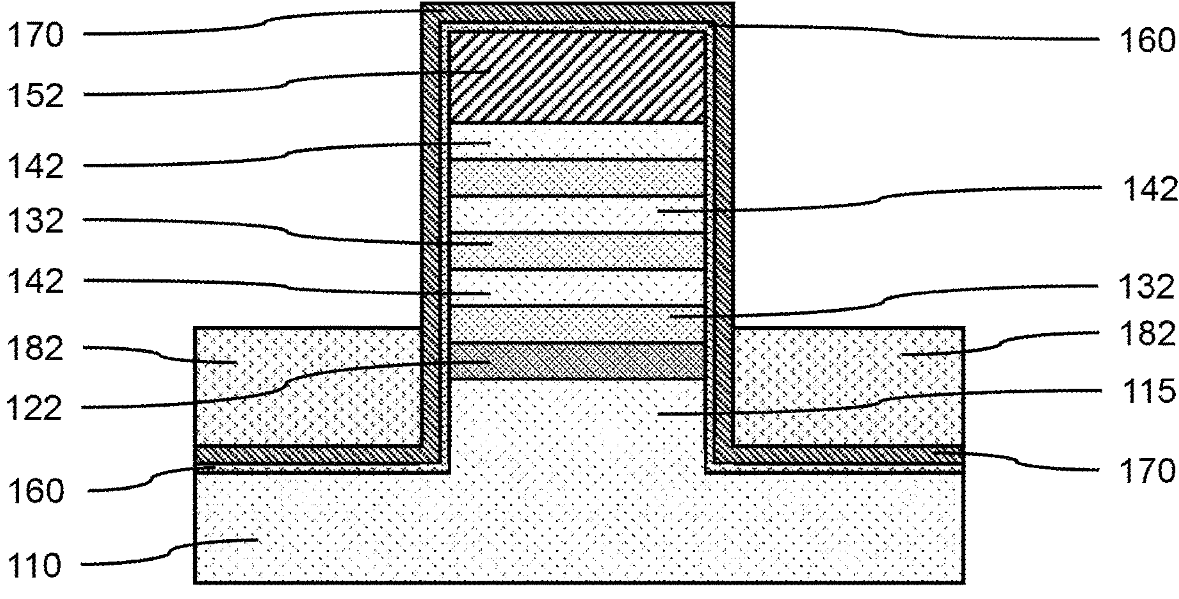
FIG. 4 is a cross-sectional side view showing the height of the gauge layer reduced to form gauge blocks that expose a predetermined portion of the spacer layer, in accordance with an embodiment of the present invention.

FIG. 4 is a cross-sectional side view showing the height of the gauge layer reduced to form gauge blocks that expose a predetermined portion of the spacer layer, in accordance with an embodiment of the present invention.

In one or more embodiments, the height of the gauge layer 180 can be reduced to expose a predetermined portion of the spacer layer 170 on the sidewalls of the segment stack 133, where the height of the gauge layer 180 can be reduced by removing an portion of the gauge layer using a selective isotropic etch (e.g., wet chemical etch, dry plasma etch) or a selective directional etch (e.g., RIE) in combination with a selective isotropic etch to remove portions of the gauge layer 180 along the sidewalls of the segment stack 133 and mesa 115. In various embodiments, the height of the gauge layer 180 can be reduced to below the nanosheet segment 142 closest to the mesa 115, such that the top surface(s) of a gauge block 182 is between the top and bottom surfaces of the intermediate sacrificial segment 132 adjoining the bottom sacrificial segment 122. A portion of the spacer layer 170 on the segment stack 133 and nanosheet template 152 can be exposed by formation of the gauge block(s) 182.

In various embodiments, the gauge block(s) 182 can have a height from the top surface of the underlying spacer layer 170 in a range of about 25 nm to about 300 nm, or about 50 nm to about 200 nm, although other heights are also contemplated.

Figure 5:
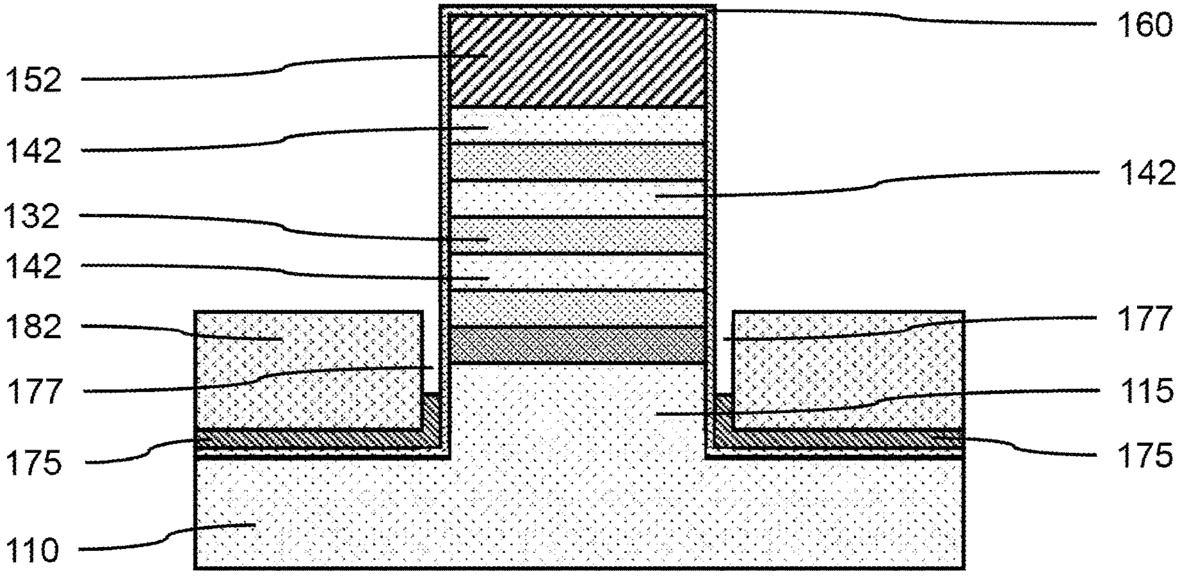
FIG. 5 is a cross-sectional side view showing the exposed portion of the spacer layer removed, and a portion of the spacer layer between the gauge blocks and stack liner also removed to form a trench, in accordance with an embodiment of the present invention.

FIG. 5 is a cross-sectional side view showing the exposed portion of the spacer layer removed, and a portion of the spacer layer between the gauge blocks and stack liner also removed to form a trench, in accordance with an embodiment of the present invention.

In one or more embodiments, the exposed portion of the spacer layer 170 can be removed using a selective isotropic etch (e.g., wet chemical etch) to form spacer layer sections 175. A portion of the spacer layer 170 below the top surface of the gauge block(s) 182 can also be removed using the selective isotropic etch to form a trench 177 between the gauge blocks and the stack liner 160, where the spacer layer 170 can be removed to below the top surface of the mesa 115. Removal of the portion of the spacer layer 170 can expose the underlying portion of the stack liner 160 on the segment stack 133 and nanosheet template 152, and along the bottom sacrificial segment 122 and an upper portion of the mesa 115. The portions of the spacer layer 170 forming the spacer layer sections 175 can remain adjacent to a lower portion of the mesa 115, such that the spacer layer sections 175 can have an L-shaped cross-section.

Figure 6:
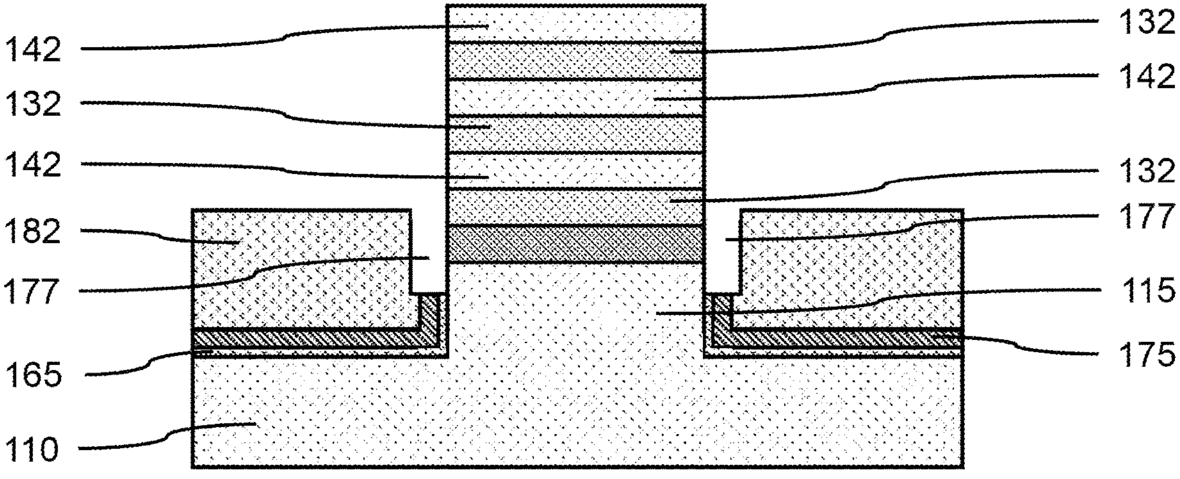
FIG. 6 is a cross-sectional side view showing the exposed portion of the stack liner removed, and the width of the trench increased by removing a portion of the gauge blocks adjoining the trench, in accordance with an embodiment of the present invention.

FIG. 6 is a cross-sectional side view showing the exposed portion of the stack liner removed, and the width of the trench increased by removing a portion of the gauge blocks adjoining the trench, in accordance with an embodiment of the present invention.

In one or more embodiments, the exposed portion of the stack liner 160 can be removed, where the exposed portion of the stack liner 160 can be removed using a selective isotropic etch (e.g., wet chemical etch) to form stack liner sections 165. A portion of the stack liner sections 165 can be on a lower portion of the mesa 115. Removal of the exposed portion of the stack liner 160 can also remove an additional portion of the gauge block(s) 182 that can increase the width of the trench(es) 177, and further reduce the height of the gauge block(s) 182 by the thickness of the stack liner 160, where the stack liner 160 and gauge blocks 182 are the same dielectric material.

Figure 7:
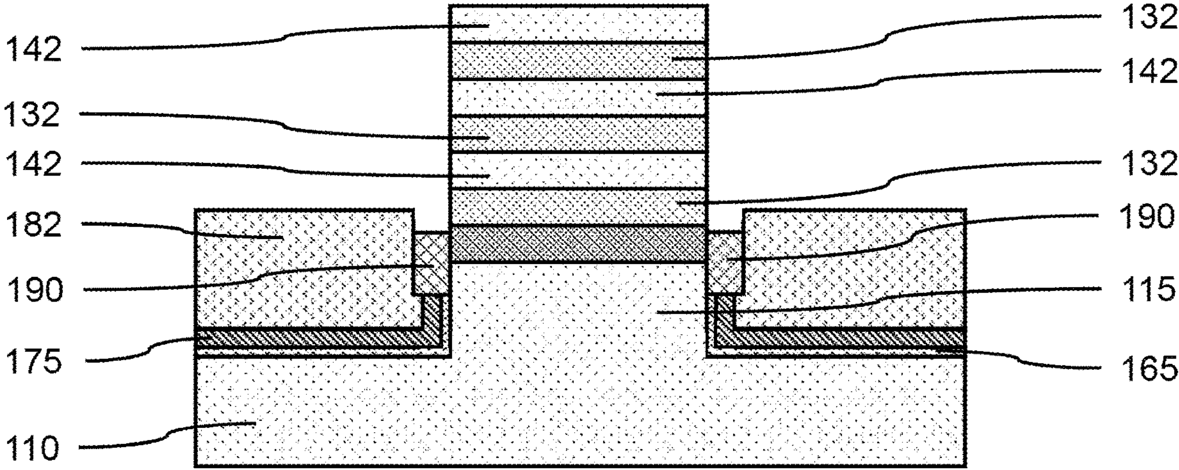
FIG. 7 is a cross-sectional side view showing a plug formed in the widened trench, where the plug covers a portion of the mesa and bottom sacrificial segment directly on the mesa, in accordance with an embodiment of the present invention.

FIG. 7 is a cross-sectional side view showing a plug formed in the widened trench, where the plug covers a portion of the mesa and bottom sacrificial segment directly on the mesa, in accordance with an embodiment of the present invention.

In one or more embodiments, a plug 190 can be formed in the widened trenches 177, where the plug 190 can be formed by a conformal depiction (e.g., ALD, PEALD) and an etch back using a selective etch. The plug 190 can be formed on the exposed edge of the spacer layer sections 175 and stack liner sections 165. A top surface of the plugs 190 can be below the interface of the bottom sacrificial segment 122 and the directly overlying segment, which can be an intermediate sacrificial segment 132. The top surface of the plug(s) 190 can be below the top surface of the gauge blocks 182.

In various embodiments, the plug(s) 190 can be a selectively removable material, for example, titanium oxide (TiO), or the same material as the bottom sacrificial layer 120. The plug(s) 190 can be silicon-germanium (SiGe) having a germanium concentration of at least 50 atomic percent (at. %), or a germanium concentration in a range of about 55 at. % to about 75 at. %, or about 60 at. %. The plug(s) 190 can be the same material as the bottom sacrificial layer 120, so both the bottom sacrificial layer 120 and plug(s) 190 can be removed using the same etching step.

Figure 8:
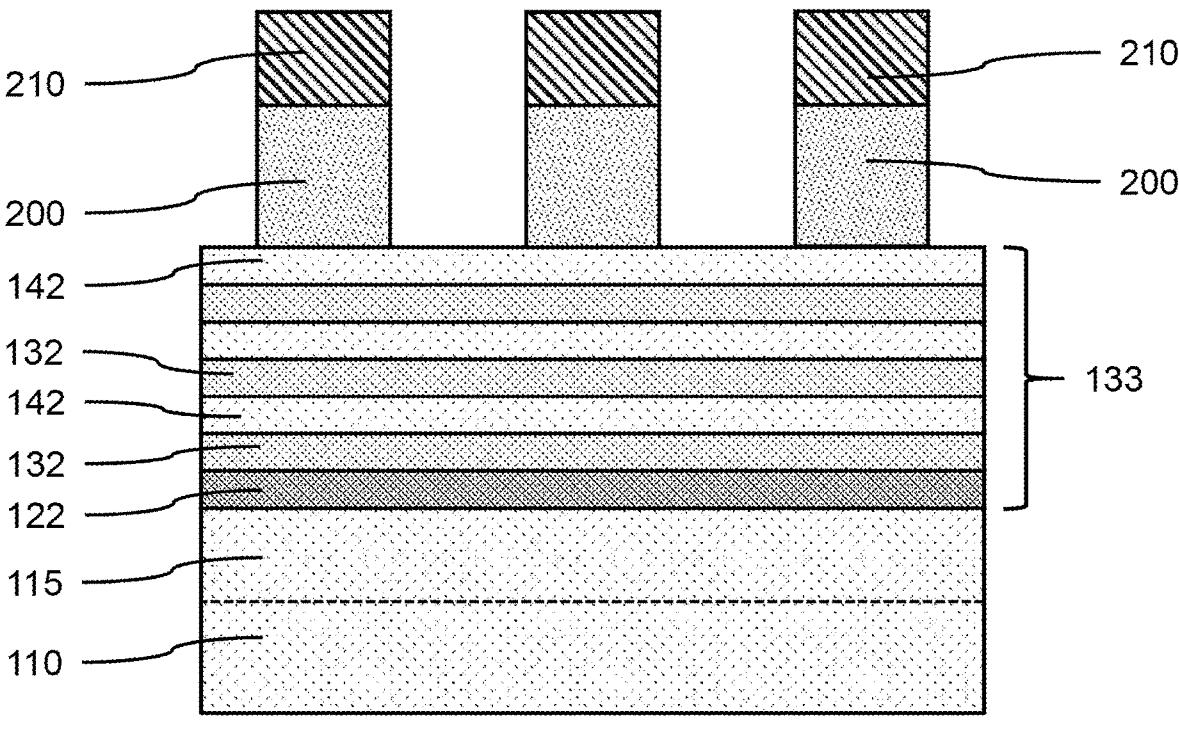
FIG. 8 is a cross-sectional side view perpendicular to FIG. 7 through the segment stack showing a plurality of dummy gates and dummy gate caps formed across the long axis of the stack of alternating sacrificial segments and nanosheet segments, in accordance with an embodiment of the present invention.

FIG. 8 is a cross-sectional side view perpendicular to FIG. 7 through the segment stack showing a plurality of dummy gates and dummy gate caps formed across the long axis of the stack of alternating sacrificial segments and nanosheet segments, in accordance with an embodiment of the present invention.

In one or more embodiments, a plurality of dummy gates 200 can be formed on the segment stack 133 by forming a dummy gate layer and patterning the dummy gate layer using lithographic processes and etching (e.g., RIE). Dummy gate caps 210 can be formed on each of the dummy gates 200 from a dummy gate cap layer, as part of the lithographic processes and etching.

In various embodiments, the dummy gate layer and dummy gates 200 can be a selectively removable material that can be easily etched, for example, amorphous silicon (a-Si), polycrystalline silicon (pc-Si), amorphous carbon (a-C), and combinations thereof.

Figure 9:
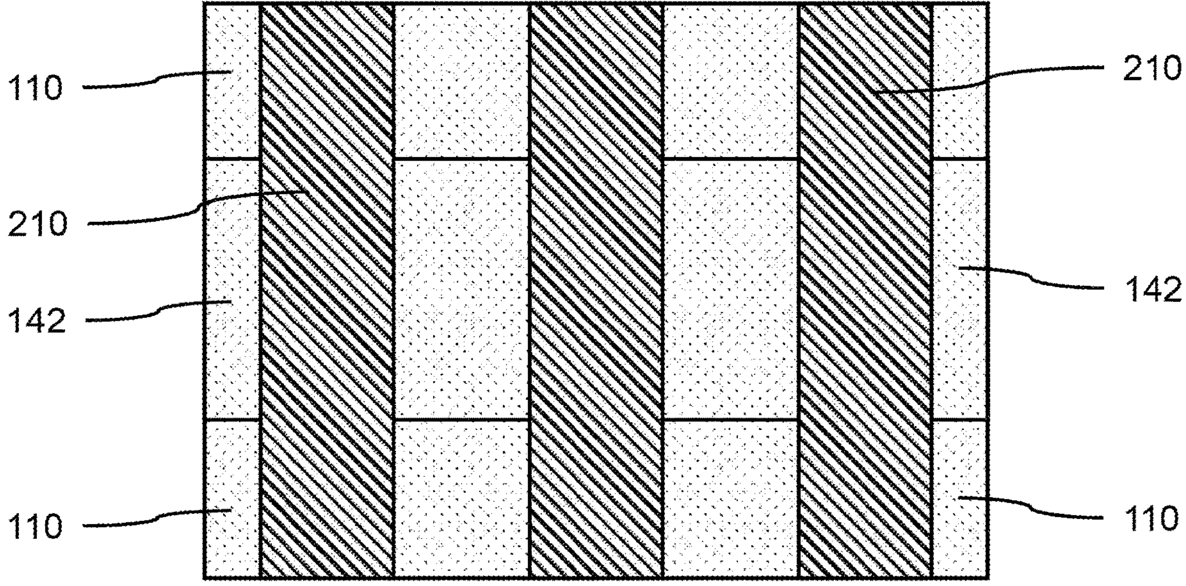
FIG. 9 is a top view showing the plurality of dummy gates and dummy gate caps formed across the long axis of the stack of alternating sacrificial segments and nanosheet segments, in accordance with an embodiment of the present invention.

FIG. 9 is a top view showing the plurality of dummy gates and dummy gate caps formed across the long axis of the stack of alternating sacrificial segments and nanosheet segments, in accordance with an embodiment of the present invention.

In one or more embodiments, the plurality of dummy gates 200 and dummy gate caps 210 can be formed across the long axis of the segment stack 133, such that there are regions of the segment stack under a dummy gate and gate cap, regions of the segment stack between two adjacent dummy gates and gate caps, and regions of the segment stack extending beyond the outermost dummy gates and gate caps.

Figure 10:
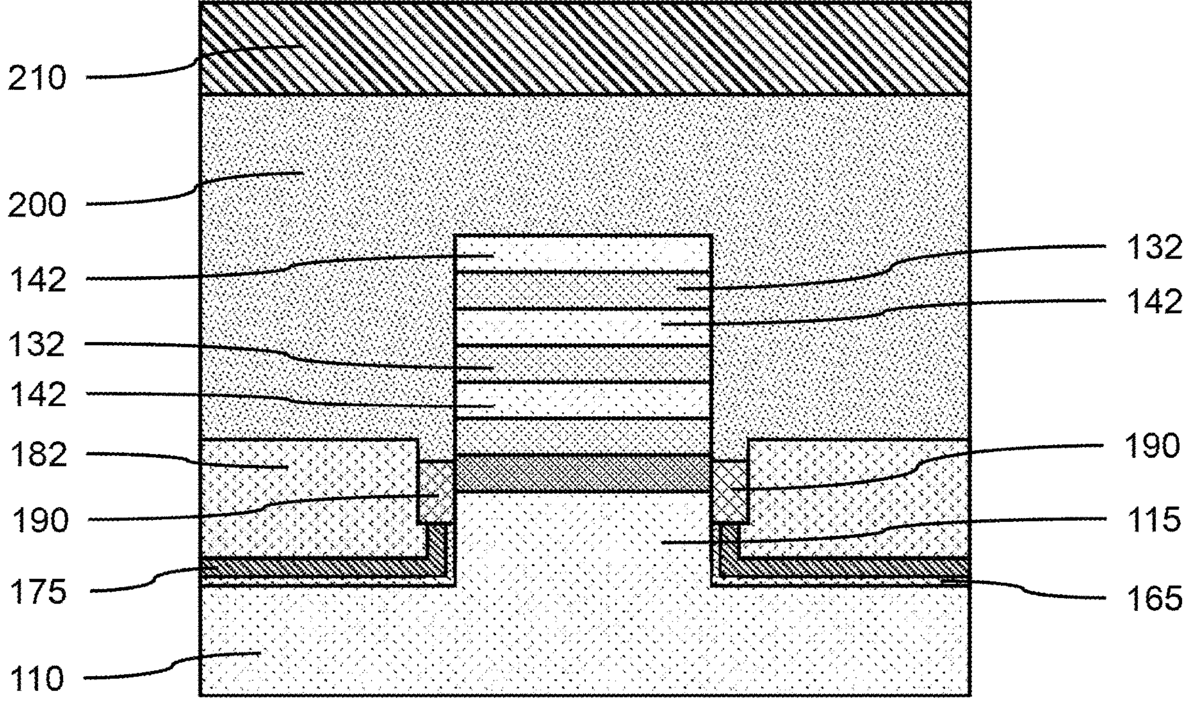
FIG. 10 is a cross-sectional side view showing one of the plurality of dummy gates and dummy gate caps across the stack of alternating sacrificial segments and nanosheet segments, in accordance with an embodiment of the present invention.

FIG. 10 is a cross-sectional side view showing one of the plurality of dummy gates and dummy gate caps across the stack of alternating sacrificial segments and nanosheet segments, in accordance with an embodiment of the present invention.

In one or more embodiments, a dummy gate 200 can cover a portion of the sidewalls of the segment stack 133. The dummy gate caps 210 can cover the dummy gate 200 and a gate sidewall can be around the dummy gates.

Figure 11:
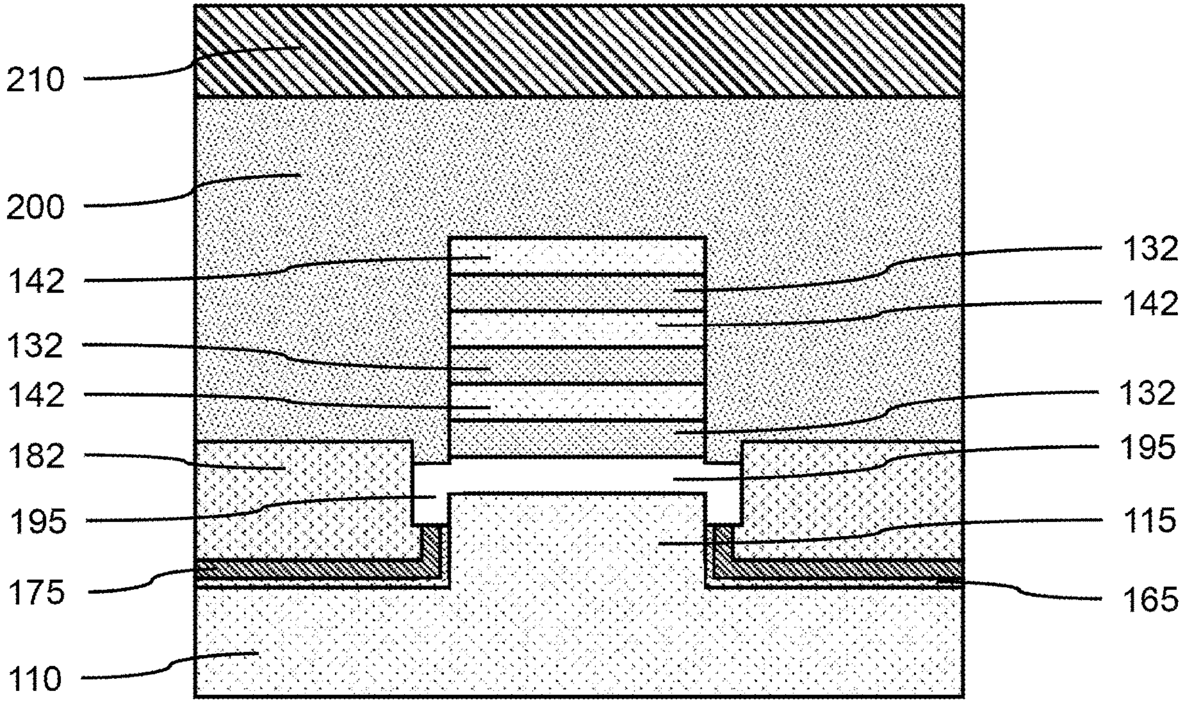
FIG. 11 is a cross-sectional side view showing the bottom sacrificial segment directly on the mesa removed to form a conduit between the top surface of the mesa and an adjacent sacrificial segment, in accordance with an embodiment of the present invention.

FIG. 11 is a cross-sectional side view showing the bottom sacrificial segment directly on the mesa removed to form a conduit between the top surface of the mesa and an adjacent sacrificial segment, in accordance with an embodiment of the present invention.

In one or more embodiments, the plug(s) 190 and the bottom sacrificial segment 122 can be removed to form a conduit 195 between the top surface of the mesa 115 and an adjacent intermediate sacrificial segment 132 and in the reopened trenches 177, where the conduit 195 can have extensions along the sidewalls of the mesa 115, such that the conduit has an upside-down U-shape over the mesa. In various embodiments, the plug(s) 190 can be removed using a selective isotropic etch to expose portions of the bottom sacrificial segment 122, and the bottom sacrificial segment 122 can be removed using a subsequent isotropic etch, where the bottom sacrificial segment 122 and bottom sacrificial segment 122 are different materials. Where the bottom sacrificial segment 122 and plug(s) 190 are the same material, a single isotropic etch can be used to remove both.

Figure 12:
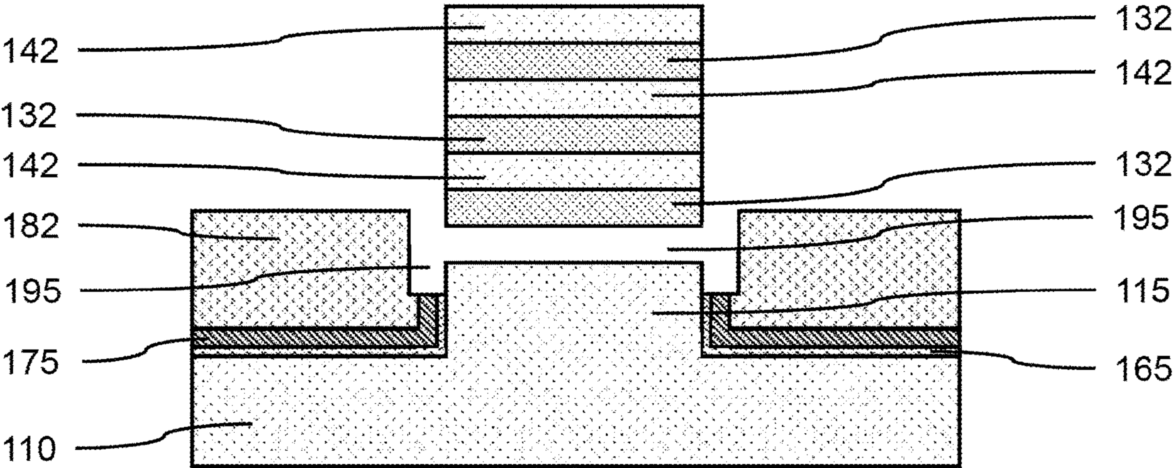
FIG. 12 is a cross-sectional side view between two adjacent dummy gates and gate caps showing the bottom sacrificial segment directly on the mesa removed to form a conduit between the top surface of the mesa and the adjacent sacrificial segment, in accordance with an embodiment of the present invention.

FIG. 12 is a cross-sectional side view between two adjacent dummy gates and gate caps showing the bottom sacrificial segment directly on the mesa removed to form a conduit between the top surface of the mesa and the adjacent sacrificial segment, in accordance with an embodiment of the present invention.

In one or more embodiments, removal of the plug(s) 190 and bottom sacrificial segment 122 can expose portions of the immediately adjacent intermediate sacrificial segment 132, between the plurality of dummy gates 200 and at the ends of the segment stack 133. Portions of the segment stack 133 can be supported by the dummy gates 200 allowing the segment stack 133 to be undercut by removing the adjacent intermediate sacrificial segment 132. The upside-down U-shape conduit 195 can separate the segment stack 133 from the mesa 115 and substrate 110, and the extensions can separate the sidewalls of the mesa from the sidewalls of the gauge blocks 182.

Figure 13:
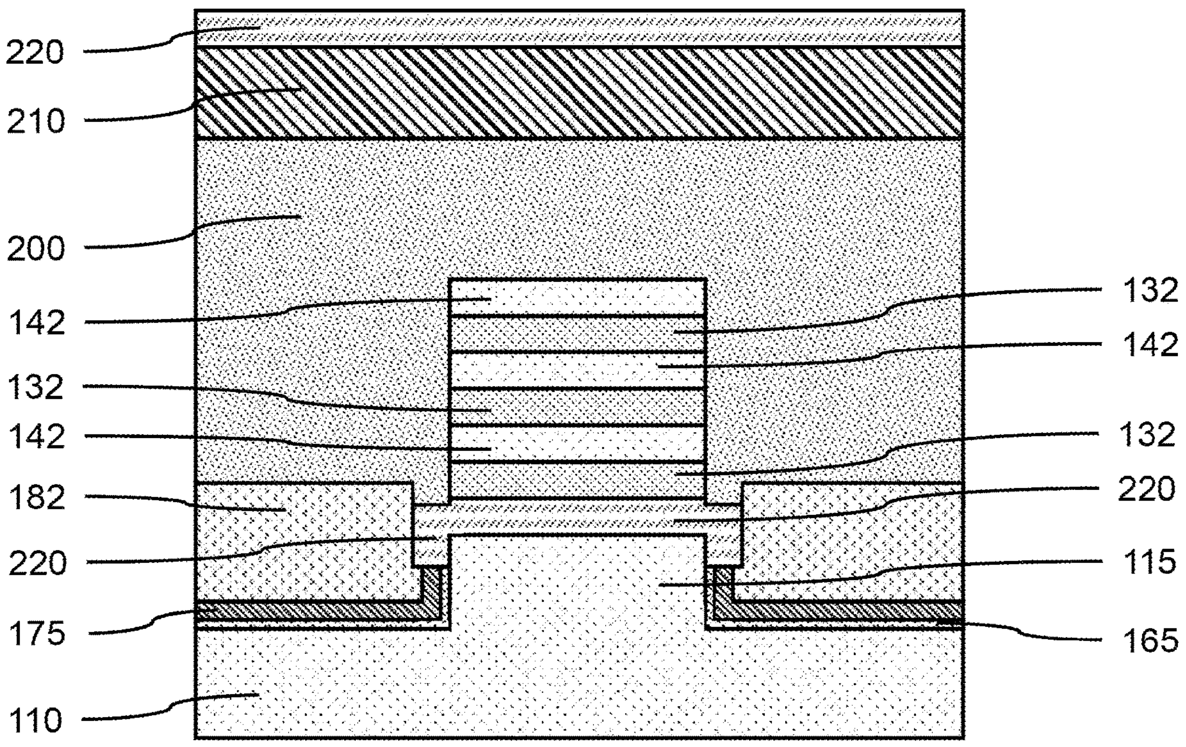
FIG. 13 is a cross-sectional side view of a region of the segment stack under the dummy gate and gate cap showing a fill layer formed on the exposed surfaces and in the conduit between the mesa and the sacrificial segment, in accordance with an embodiment of the present invention.

FIG. 13 is a cross-sectional side view of a region of the segment stack under the dummy gate and gate cap showing a fill layer formed on the exposed surfaces and in the conduit between the mesa and the sacrificial segment, in accordance with an embodiment of the present invention.

In one or more embodiments, a fill layer 220 can be formed on the exposed surfaces including the surfaces forming the conduit 195 and reopened trenches 177, where the fill layer 220 can be formed by a conformal deposition (e.g., ALD, PEALD). The conformal deposition can fill in the trenches 177 and the conduit 195, including the extensions, below the dummy gates 200 and between the mesa surface and adjacent intermediate sacrificial segment 132. In various embodiments, the fill layer 220 can be formed in the conduit 195 without forming a pinch-off or void space, with a seam where the deposited layer meets, or with airgaps depending on the deposition method and parameter control. The fill layer 220 can have an upside-down U-shape on the mesa 115 below the dummy gates 200 from filling in the conduit 195 with the extensions.

In various embodiments, the fill layer 220 can be a dielectric material, including, but not limited to, a low-k dielectric material, silicon nitride (SiN), silicon oxy carbonitride (SiOCN), and combinations thereof. In various embodiments, the fill layer 220 can be a dielectric material that is selectively etchable relative to gauge blocks 182, intermediate sacrificial segment 132, nanosheet segments 142, and dummy gate caps 210.

In various embodiments, the fill layer 220 can have a thickness in a range of about 4 nanometers (nm) to about 15 nm, or about 6 nm to about 10 nm, although other thicknesses are also contemplated. The thickness of the fill layer 220 can be greater than half of the thickness of the bottom sacrificial layer 120, so the fill layer 220 can fill in the conduit 195.

Figure 14:
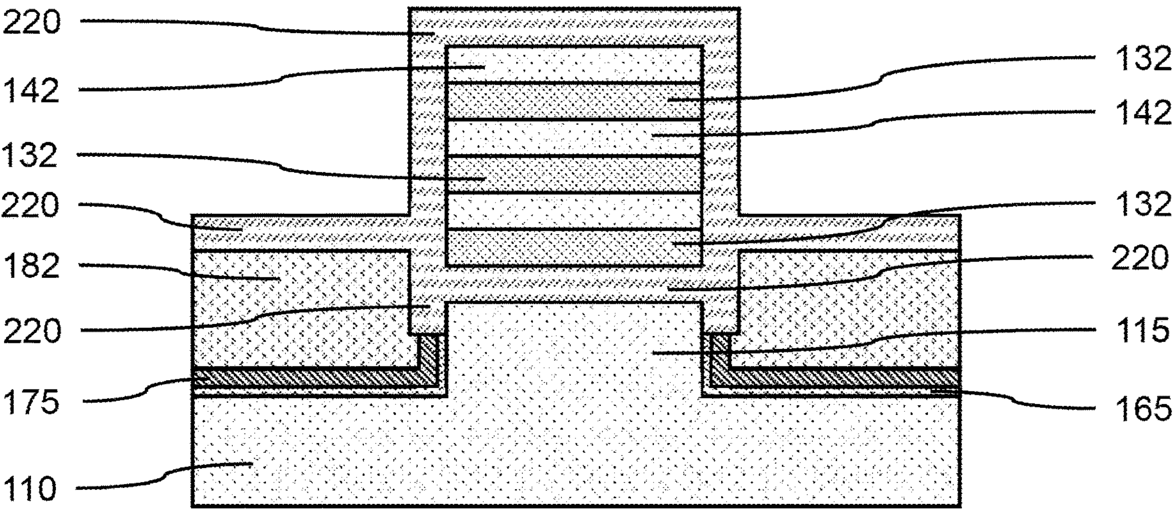
FIG. 14 is a cross-sectional side view between two adjacent dummy gates and gate caps, laterally offset from the dummy gate in FIG. 13, showing the fill layer formed on the exposed surfaces of the stack and in the conduit between the mesa and the stack, in accordance with an embodiment of the present invention.

FIG. 14 is a cross-sectional side view between two adjacent dummy gates and gate caps, laterally offset from the dummy gate in FIG. 13, showing the fill layer formed on the exposed surfaces of the stack and in the conduit between the mesa and the stack, in accordance with an embodiment of the present invention.

In one or more embodiments, the fill layer 220 can be formed on the exposed surfaces of the segment stack 133 and gauge blocks 182, including the top surface portions of the top most intermediate sacrificial segment 132 exposed between the dummy gates 200. The fill layer 220 can encapsulate a portion of the segment stack 133 between adjacent gate structures formed by the dummy gates and gate caps.

Figure 15:
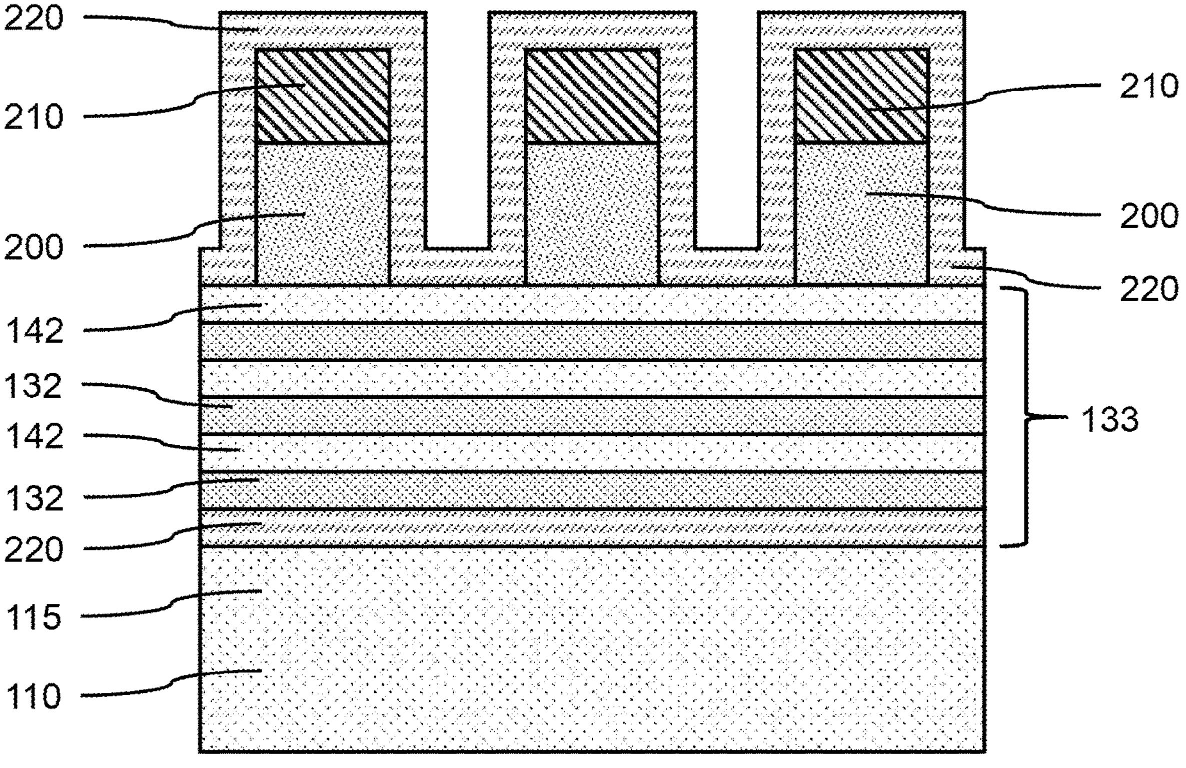
FIG. 15 is a cross-sectional side view along the long axis of the segment stack showing the fill layer on the plurality of dummy gates and dummy gate caps and in the conduit between the mesa and the stack, in accordance with an embodiment of the present invention.

FIG. 15 is a cross-sectional side view along the long axis of the segment stack showing the fill layer on the plurality of dummy gates and dummy gate caps and in the conduit between the mesa and the stack, in accordance with an embodiment of the present invention.

In various embodiments, the fill layer 220 can be formed on the top surface of the dummy gate caps 210 and sidewalls of the plurality of dummy gates 200. A portion of the fill layer 220 can extend along the length of the remaining layers of the segment stack 133, where the portion of the fill layer 220 can replace the bottom sacrificial segment 122 in the segment stack 133.

Figure 16:
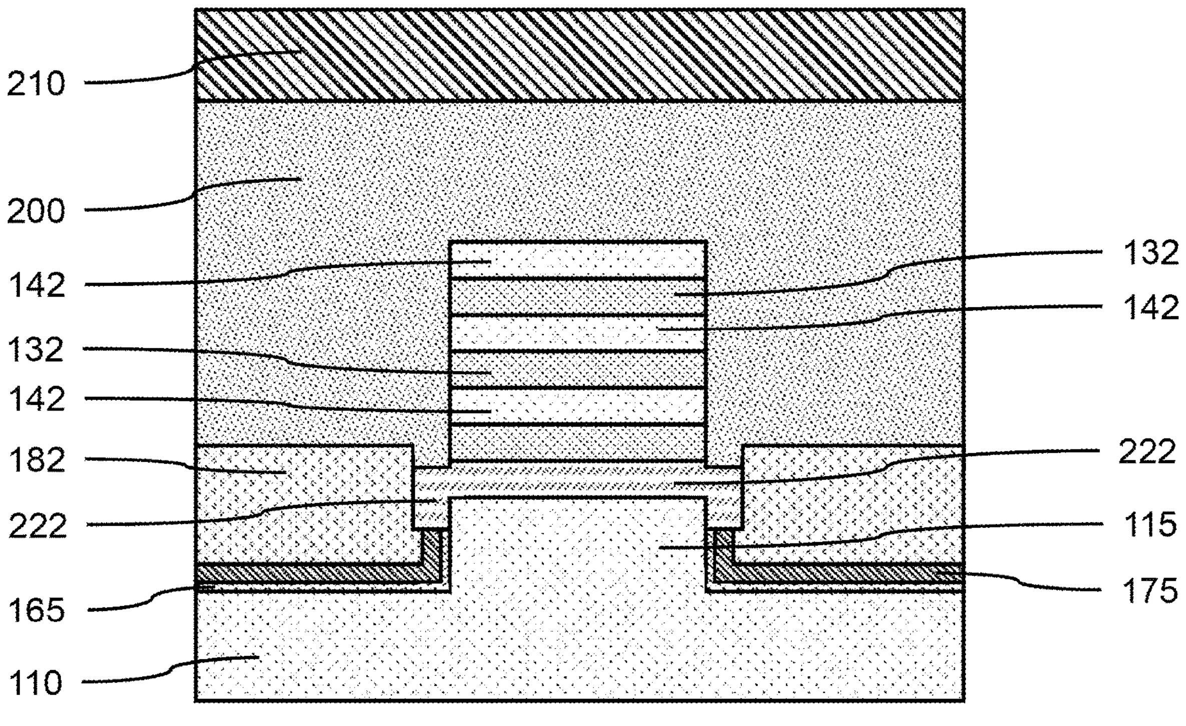
FIG. 16 is a cross-sectional side view of a region of the segment stack under the dummy gate and gate cap showing a portion of the fill layer removed from the dummy gate cap, in accordance with an embodiment of the present invention.

FIG. 16 is a cross-sectional side view of a region of the segment stack under the dummy gate and gate cap showing a portion of the fill layer removed from the dummy gate cap, in accordance with an embodiment of the present invention.

In one or more embodiments, exposed portion of the fill layer 220 can be removed using a selective directional etch (e.g., RIE) to form fill layer sections 222 on surfaces approximately perpendicular to the direction of the etchant. The portion of the fill layer 220 can be removed from the dummy gate cap 210, while remaining on the sidewalls of the dummy gates 220 and in the conduit 195. The portion of the fill layer section 222 in the conduit 195 under the dummy gate 220 can form a cap over the upper portion of the mesa 115, where the cross-section of the fill layer section 222 can have an upside-down U-shape underneath the gate structure and an H-shape between the gate structures. Different regions of the fill layer section 222, therefore, have different shapes.

Figure 17:
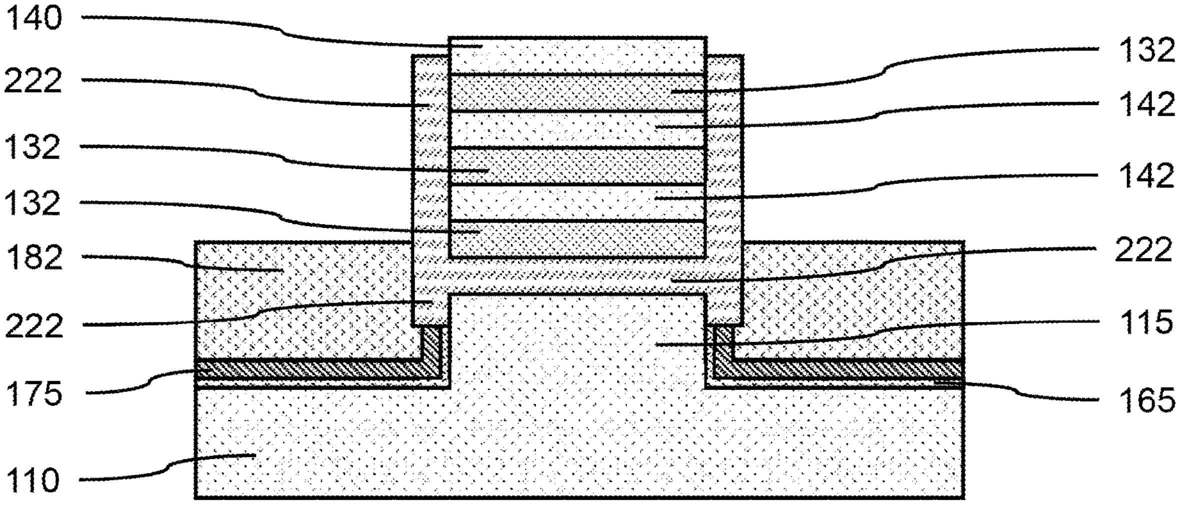
FIG. 17 is a cross-sectional side view between two adjacent dummy gates and gate caps showing a portion of the fill layer removed from the top-most nanosheet segment and the reduced height gauge layer, in accordance with an embodiment of the present invention.

FIG. 17 is a cross-sectional side view between two adjacent dummy gates and gate caps showing a portion of the fill layer removed from the top-most nanosheet segment and the reduced height gauge layer, in accordance with an embodiment of the present invention.

In various embodiments, the fill layer 220 can be removed from the top surface portions of the top most intermediate sacrificial segment 132 and top surface portions of the gauge blocks 182 exposed between the dummy gates 200, while remaining on the sidewalls of the intermediate sacrificial segments 132 and nanosheet segments 142, and in the conduit 195. The portion of the fill layer section 222 in the conduit 195 under the intermediate sacrificial segments 132 can form a cap over the upper portion of the mesa 115, and the fill layer section 222 with legs extending along the sidewalls of the intermediate sacrificial segments 132 and nanosheet segments 142 and into the conduit extensions can form an H-shaped fill layer section 222 between the gate structures.

Figure 18:
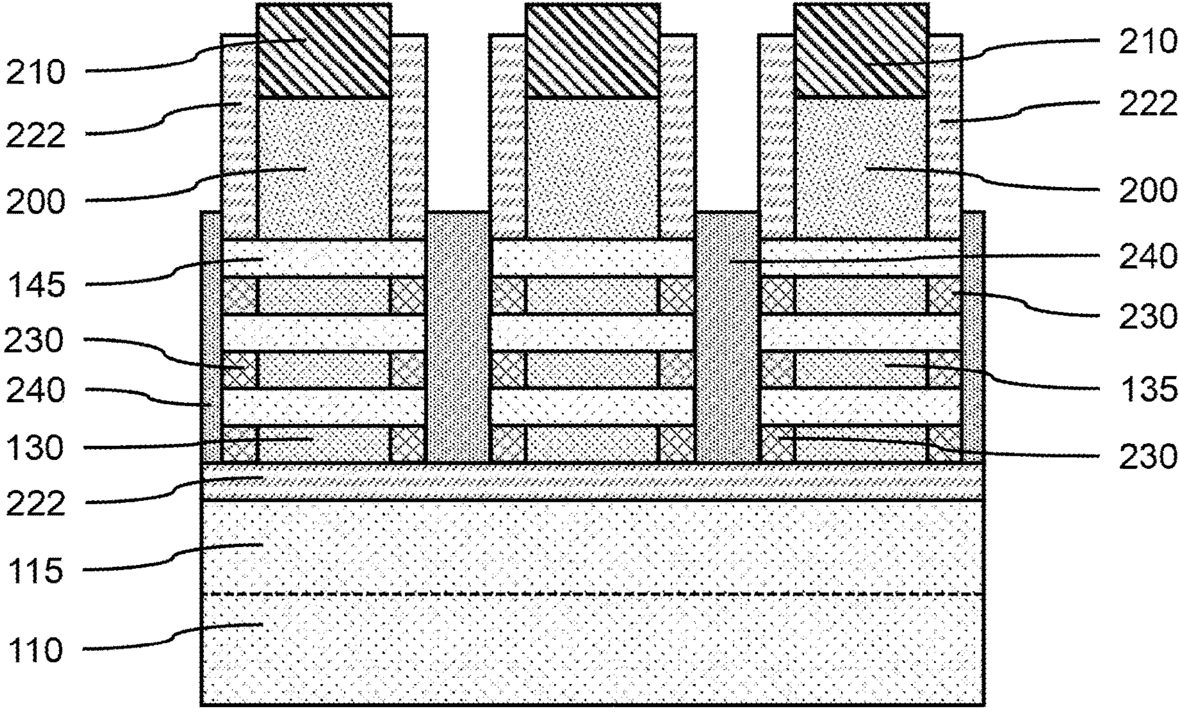
FIG. 18 is a cross-sectional side view along the long axis of the segment stack showing the fill layer on the plurality of dummy gates and dummy gate caps, inner spacers between the nanosheet sections, and source/drains formed on the stacks adjacent to the dummy gates, in accordance with an embodiment of the present invention.

FIG. 18 is a cross-sectional side view perpendicular to FIG. 17 showing the fill layer on the plurality of dummy gates and dummy gate caps, inner spacers between the nanosheet sections, and source/drains formed on the stacks adjacent to the dummy gates, in accordance with an embodiment of the present invention.

In one or more embodiments, the portions of the fill layer section 222 on the sidewalls of the dummy gates 200 and dummy gate caps 210 can form spacers that mask underlying sections of the intermediate sacrificial segments 132 and nanosheet segments 142. A portion of the top most intermediate sacrificial segment 132 can be exposed between the fill layer sections 222 on facing sidewalls of the dummy gates 200. In various embodiments, the portions of the intermediate sacrificial segments 132 and nanosheet segments 142 between the facing fill layer sections 222 can be removed to form gaps between intermediate sacrificial plates 135 and nanosheet plates 145, where the fill layer section 222 can be exposed. The portions of the intermediate sacrificial segments 132 and nanosheet segments 142 can be removed using a selective directional etch (e.g., RIE) to form facing intermediate sacrificial plates 135 and nanosheet plates 145 separated by a gap.

In various embodiments, portions of the intermediate sacrificial plates 135 can be removed using a selective isotropic etch to form a recess between vertically adjacent nanosheet plates 145. An inner spacer 230 can be formed in each of the recesses using a conformal deposition and an isotropic etch. In various embodiments, the inner spacers 230 can be a dielectric material, including, but not limited to, silicon oxide (SiO), silicon nitride (SiN), silicon oxynitride (SiON), low-k dielectric materials, and combinations thereof. The low-k dielectric materials can be carbon-doped silicon oxide (SiO:C), fluorine doped silicon oxide (SiO:F), and combinations thereof.

In one or more embodiments, source/drains 240 can be formed in the gaps between the adjacent inner spacers 230 and nanosheet plates 145 by epitaxial growth on the exposed end walls of the and nanosheet plates 145. The source/drains 240 can be n-type source/drains or p-type source/drains depending on the dopant(s) introduced during formation (i.e., in situ). In various embodiments, the source/drains 240 can be silicon (Si) or silicon-germanium (SiGe), where the silicon-germanium (SiGe) source/drains can be doped with a p-type dopant (e.g., boron (B), gallium (Ga), etc.) and the silicon (Si) can be doped with an n-type dopant (e.g., phosphorus (P), arsenic (As), etc.). Portions of the fill layer sections 222 shown in FIG. 17 can be on opposite sides of the source/drains 240, where the intermediate sacrificial segments 132 and nanosheet segments 142 have been previously removed.

In various embodiments, the top surfaces of the source/drains can be above the top surfaces of the top-most nanosheet plates 145.

Figure 19:
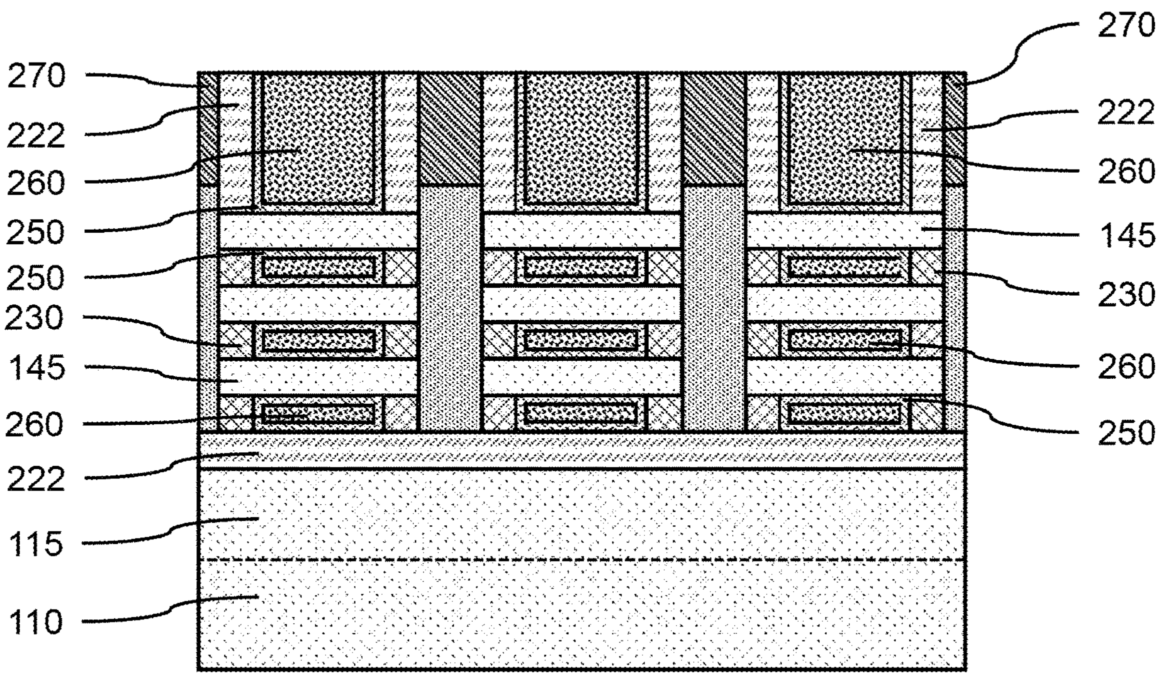
FIG. 19 is a cross-sectional side view along the long axis of the segment stack showing the dummy gate caps removed and the plurality of dummy gates replaced with a gate structure on the nanosheet sections, in accordance with an embodiment of the present invention.

FIG. 19 is a cross-sectional side view perpendicular to FIG. 17 showing the dummy gate caps removed and the plurality of dummy gates replaced with a gate structure on the nanosheet sections, in accordance with an embodiment of the present invention.

In one or more embodiments, the dummy gate caps 210 can be removed using a selective etch (isotropic or directional) to expose the underlying dummy gates 200 within dummy gate sidewalls. In various embodiments, the dummy gates 200 can be removed using an isotropic etch (e.g., wet chemical etch) to expose the intermediate sacrificial plates 135 and nanosheet plates 145.

In one or more embodiments, the intermediate sacrificial plates 135 can be removed using an isotropic etch to expose the surfaces of the nanosheet plates 145.

In one or more embodiments, a gate dielectric layer 250 can be formed on the exposed surfaces of the nanosheet plates 145 and on the exposed surfaces of the fill layer sections 222 and inner spacers 230. The gate dielectric layer 250 can be formed by a conformal deposition (e.g., ALD, PEALD).

In various embodiments, the gate dielectric layer 250 can be a dielectric material, including, but not limited to, silicon oxide (SiO), silicon nitride (SiN), silicon boro carbonitride (SiBCN), a high-k dielectric, and combinations thereof. The high-k dielectric material can include, but not limited to, metal oxides, for example, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k dielectric material may further include dopants such as lanthanum, aluminum, magnesium, or combinations thereof.

In various embodiments, the gate dielectric layer 250 can have a thickness in a range of about 1 nm to about 3 nm, or about 2 nm, although other thicknesses are also contemplated.

In one or more embodiments, a conductive gate electrode 260 can be formed on the gate dielectric layer 250 using a conformal deposition. In various embodiments, the conductive gate electrode 260 can be any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube (s), conductive carbon, graphene, or any suitable combination of these materials. The conductive material may further comprise dopants that are incorporated during or after deposition.

Figure 20:
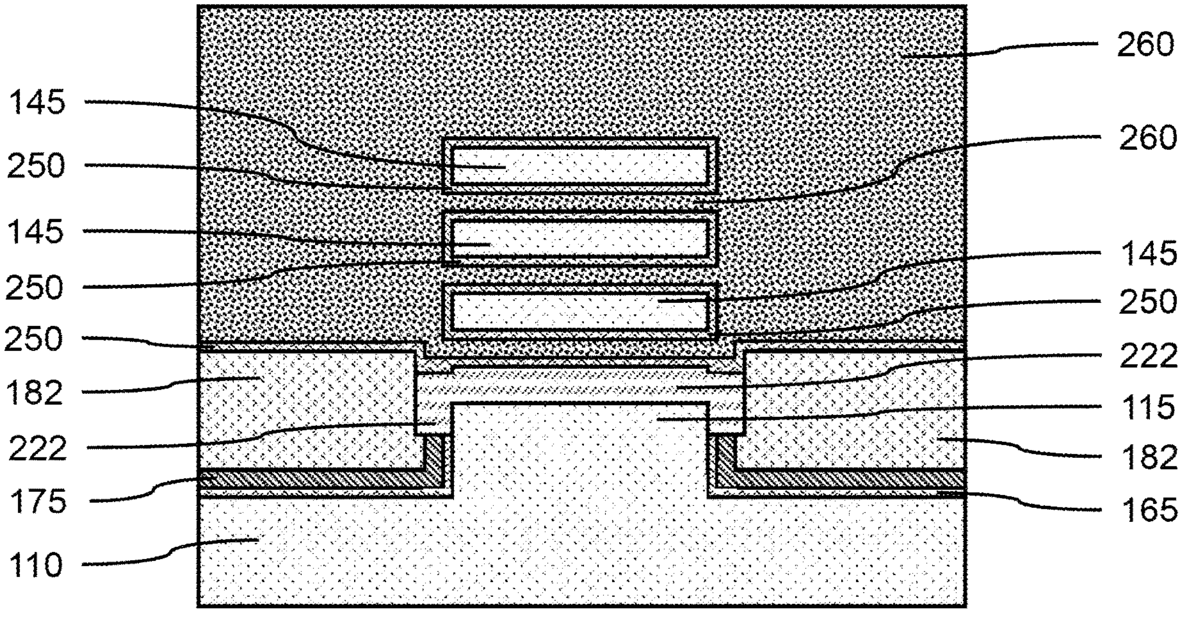
FIG. 20 is a cross-sectional side view showing the gate structure on the nanosheet sections, and the fill layer between the gate structure and the mesa, in accordance with an embodiment of the present invention.

FIG. 20 is a cross-sectional side view showing the gate structure on the nanosheet sections, and the fill layer between the gate structure and the mesa, in accordance with an embodiment of the present invention.

In one or more embodiments, the conductive gate electrode 260 and the gate dielectric layer 250 can surround the nanosheet plates 145 to form a gate-all-around (GAA) gate structure. The fill layer section 222 in the conduit 195 between the mesa 115 and the adjacent nanosheet plate 145, and the gate dielectric layer 250 on the fill layer section 222 in the conduit 195 can physically and electrically separate the gate structure from the mesa 115 and substrate 110, which reduces leakage current to the substrate 110 and reduces the parasitic capacitance between the gate structure and the substrate 110.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A nanosheet transistor device, comprising:

a fill layer section on a top surface and at least a portion of opposite sidewalls of a mesa, wherein the mesa is on a substrate;

one or more nanosheet plates above the fill layer section, wherein the fill layer section is beneath at least a portion of the one or more nanosheet plates and extends from a first side of the one or more nanosheet plates to a second side of the one or more nanosheet plates opposite the first side; and a stack liner section on a portion of opposite sidewalls of the mesa below the fill layer section, wherein the stack liner section separates a gauge block from the substrate.

2. The nanosheet transistor device of claim 1, further comprising a spacer layer section on the stack liner section, wherein the fill layer section is on the stack liner section and the spacer layer section.

3. The nanosheet transistor device of claim 2, wherein the gauge block is on the spacer layer section.

4. The nanosheet transistor device of claim 3, wherein a top surface of the gauge block is above a top surface of the fill layer section on the mesa.

5. The nanosheet transistor device of claim 4, further comprising a gate dielectric layer on a top surface of the fill layer section, a top surface of the gauge block, and a portion of a sidewall surface of the gauge block.

6. The nanosheet transistor device of claim 3, wherein the fill layer section is a dielectric material selected from the group consisting of a low-k dielectric material, silicon nitride (SiN), silicon oxy carbonitride (SiOCN), and combinations thereof.

7. The nanosheet transistor device of claim 5, wherein the gate dielectric layer is a dielectric material selected from the group consisting of silicon oxide (SiO), a high-k dielectric, and combinations thereof.

8. The nanosheet transistor device of claim 7, wherein the stack liner section is a dielectric material selected from the group consisting of silicon oxide (SiO), silicon oxynitride (SiON), and combinations thereof.

9. A nanosheet transistor device, comprising:

a fill layer section on a top surface and at least a portion of opposite sidewalls of a mesa, wherein the mesa is on a substrate;

one or more nanosheet plates above the fill layer section, wherein the fill layer section is beneath at least a portion of the one or more nanosheet plates and extends from a first side of the one or more nanosheet plates to a second side of the one or more nanosheet plates opposite the first side;

a gate dielectric layer on the fill layer section and each of the one or more nanosheet plates; and a stack liner section on a portion of opposite sidewalls of the mesa below the fill layer section, wherein the stack liner section separates a gauge block from the substrate.

10. The nanosheet transistor device of claim 9, wherein the fill layer section has a thickness in a range of about 4 nanometers (nm) to about 15 nm.

11. The nanosheet transistor device of claim 10, wherein the gauge block is in direct contact with a portion of the fill layer section.

12. The nanosheet transistor device of claim 9, further comprising a spacer layer section on the stack liner section, wherein the spacer layer section separates the gauge block from the stack liner section and the mesa.

13. A nanosheet transistor device, comprising:

a fill layer section on a mesa, wherein the mesa is on a substrate;

one or more nanosheet plates above the fill layer section, wherein a cross-section of the fill layer section has an upside-down U-shape underneath the one or more nanosheet plates and an H-shape between a first gate structure and a second gate structure;

a gate dielectric layer on the fill layer section and each of the one or more nanosheet plates; and a stack liner section on a portion of opposite sidewalls of the mesa below the fill layer section, wherein the stack liner section separates a gauge block from the substrate.

14. The nanosheet transistor device of claim 13, wherein the fill layer section is a dielectric material selected from the group consisting of silicon nitride (SIN), silicon oxy carbonitride (SIOCN), and combinations thereof.

15. The nanosheet transistor device of claim 14, further comprising a conductive gate electrode between the fill layer section and a bottom most nanosheet plate of the one or more nanosheet plates.

16. The nanosheet transistor device of claim 15, wherein the gauge block is adjacent to the fill layer section.

17. The nanosheet transistor device of claim 16, further comprising a spacer layer section between the gauge block and the stack liner section.

* * * * *